United States Patent [19]

Spiegel

[11] Patent Number: 5,408,044

[45] Date of Patent: Apr. 18, 1995

[54] TELEVISION REMOTE CONTROL ADAPTOR

[75] Inventor: Alan M. Spiegel, New Rochelle, N.Y.

[73] Assignee: Marvin Sandler, Roslyn Heights, N.Y.

[21] Appl. No.: 3,514

[22] Filed: Jan. 12, 1993

[51] Int. Cl.6 .............................................. H02G 3/08
[52] U.S. Cl. ..................... 174/52.1; 341/21; 341/22; 359/146; 455/151.1
[58] Field of Search ................. 174/52.1; 340/825.57, 340/825.69, 825.72; 359/142, 143, 146, 148, 180; 455/151.1, 151.2, 151.4, 154.1, 153.1, 128, 352, 353, 354, 355; 334/8; 341/22, 176, 21; 200/257, 282, 283, 293, 296, 329, 333, 341; 361/679, 680, 727, 730, 731

[56] References Cited

U.S. PATENT DOCUMENTS

| | | | |
|---|---|---|---|
| 3,964,594 | 6/1976 | Gabbrielli et al. | 400/472 |
| 4,092,527 | 5/1978 | Luedke | 364/709.1 |
| 4,127,876 | 11/1978 | Schwartz | 455/151.2 |
| 4,389,731 | 6/1983 | Wu | 455/153.1 |
| 4,602,828 | 7/1986 | Omata | 312/319 |
| 4,623,887 | 11/1986 | Welles, II | 340/825.57 |
| 4,626,848 | 12/1986 | Ehlers | 340/825.69 |
| 4,709,405 | 11/1987 | Okazaki | 455/151 |
| 4,709,412 | 11/1987 | Seymour et al. | 455/603 |
| 4,735,377 | 4/1988 | Zuehsow | 242/107 |
| 4,768,230 | 8/1988 | Viebrantz et al. | 455/603 |
| 4,809,360 | 2/1989 | Kraft | 361/727 |
| 4,852,746 | 8/1989 | Wells et al. | 211/13 |
| 4,856,658 | 8/1989 | Novak | 211/13 |
| 4,878,055 | 10/1989 | Kasahara | 341/23 |
| 4,899,370 | 2/1990 | Kameo et al. | 379/104 |
| 4,959,810 | 9/1990 | Darbee et al. | 395/100 |
| 5,063,484 | 11/1991 | Tanaka | 362/109 |
| 5,151,696 | 9/1992 | Kasahara et al. | 341/22 |
| 5,175,876 | 12/1992 | Villacis Mendoza | 455/92 |
| 5,214,422 | 5/1993 | Cullimore | 340/825.72 |
| 5,235,328 | 8/1993 | Kurita | 340/825.72 |

Primary Examiner—Leo P. Picard
Assistant Examiner—Christopher Horgan
Attorney, Agent, or Firm—Richard C. Woodbridge

[57] ABSTRACT

A television remote control adaptor includes a protective housing for receiving the remote control unit and oversized pushbuttons for manipulating the remote control unit from outside of the adaptor. The television remote control is held in precise orientation of the adaptor by a spring retainer clip. An aperture at one end of the housing permits the infrared transmitters of the remote control unit to activate a television set. An open mesh is attached across the closed face of the housing adjacent to the remote control pushbuttons. Four or five adaptor buttons are attached to the outside of the mesh and held in place by a pair of leg protrusions that engage the mesh. A longer, thinner protrusion, also attached to the adaptor button, passes through the mesh and contacts the underlying remote control pushbuttons when the adaptor button is depressed by the user. The housing not only protects the remote control unit but it also makes it possible for the pushbuttons to be manipulated by individuals having limited visual acuity or manual dexterity.

17 Claims, 5 Drawing Sheets

TELEVISION REMOTE CONTROL ADAPTOR

BACKGROUND OF THE INVENTION

1. Field of the Invention

The invention relates to a television remote control adaptor which includes a plurality of exterior buttons for manipulating the control buttons of the remote control unit.

2. Description of the Related Art

TV remote control units have become very popular in recent years because they permit television viewers to turn a television on and off, control volume and change channels from a remote location. While TV remote controls have many advantages, they do, however, have a number of disadvantages. First, because they are manipulated so frequently, they tend to get dropped and broken on a regular basis. Second, because they are generally small and dark in color, they are relatively easy to lose. Third, because prior art TV remote control cases are small in size, they are also difficult to handle. Fourth, and perhaps most importantly, the control buttons tend to be relatively small and, therefore, hard to locate by those with limited visual capabilities and difficult to manipulate by those who have manual handicaps. These problems are just beginning to be appreciated and, consequently, there is only a modest body of relevant prior art.

U.S. Pat. No. 4,809,360 entitled ELECTRONIC EQUIPMENT REMOTE CONTROL UNIT CHASSIS describes a conventional television remote control unit which is received within a drawer which fits within a housing. While that device does protect the TV remote control unit, it is, nevertheless, moderately complex and difficult to operate.

The general concept of placing existing remote control units within a protective housing is disclosed in other parts of the prior art. For example, U.S. Pat. No. 4,709,412 entitled REMOTE CONTROL UNIT INTEGRATOR CONSOLE describes a unit in which a plurality of different remote control devices are placed within a single chassis. See also, U.S. Pat. No. 4,709,405 entitled CHANNEL SELECTING PANEL HOLDER FOR A TELEVISION SET in which a remote control transmitter is located within a protective housing that may or may not be stored within the confines of a television-like chassis.

U.S. Pat. No. 4,768,230 entitled HOUSING FOR HAND-HELD REMOTE CONTROL TRANSMITTER describes a chassis which is sealable so that it is water-tight and dust free.

U.S. Pat. Nos. 3,964,594 and 4,092,527 relate to mechanisms for manipulating the keys of pushbutton devices.

The disclosures in the following patents may also be relevant to the basic concept: U.S. Pat. Nos. 4,127,876; 4,389,731; 4,623,887; 4,626,848; 4,899,370; and 4,959,810.

In view of the foregoing, there appears to be a significant need for a protective remote control adaptor which permits the TV viewer to easily manipulate the underlying control pushbuttons and which provides the user with a larger adapter unit which is easier to hold and manipulate than the original, small TV remote control unit.

SUMMARY OF THE INVENTION

Briefly described, the invention comprises a protective chassis for receiving a television remote control such that the remote control can be easily manipulated by an individual having limited visual acuity and/or manual dexterity.

The invention includes a housing for receiving the TV remote control. A spring-loaded clip which travels in a channel in the side of the housing holds the TV remote control unit in position. An aperture located at one end of the housing permits the infrared transmitters of the TV remote control to operate the television.

A mesh, having a plurality of regular, equilateral apertures therein, covers one face of the housing. The inside surface of the mesh faces the pushbutton panel of the TV remote control unit. Four or five L-shaped adaptor pushbuttons engage the exterior surface of the mesh. Each adaptor pushbutton includes a protrusion that extends through the mesh so as to contact one of the underlying pushbuttons of the TV remote control. Pressing down on one of the adaptor buttons causes the associated protrusion to contact its respective pushbutton on the TV remote control unit. The buttons are preferably oversized in order to make it easier for individuals to manipulate them and are structured to nest to permit access to close buttons. The plastic case provides important protection to the TV remote control to prevent damage if the adaptor is dropped. The adapter case is also relatively large so that it is easy to handle and includes four feet which helps improve the stability of the device.

These and other features of the invention will be more fully understood by reference to the following drawings.

DETAILED DESCRIPTION OF THE PREFERRED EMBODIMENT

During the course of this description, like numbers will be used to identify like elements according to the different views that illustrate the invention.

Figure 1:
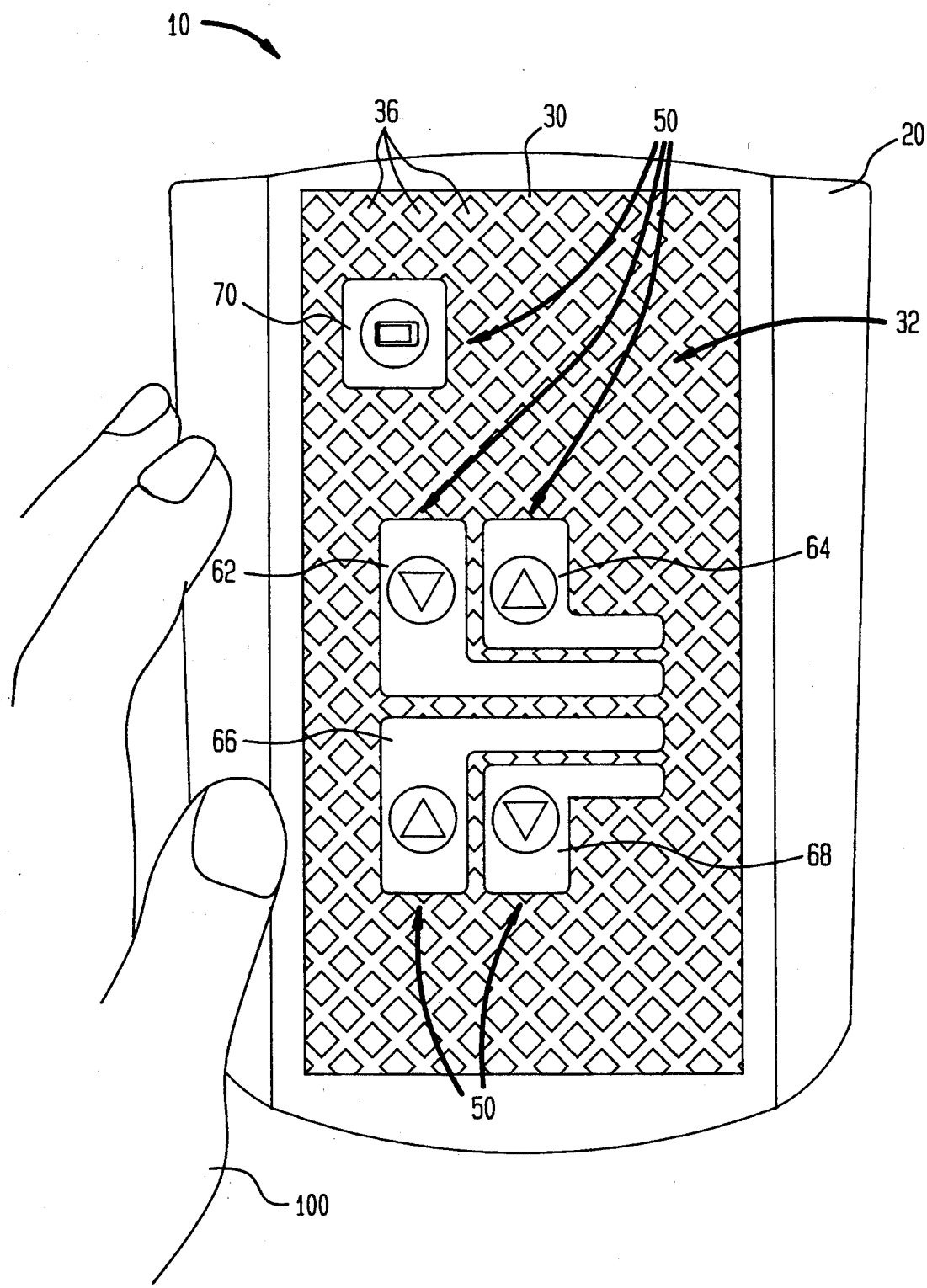
FIG. 1 is a front perspective view of the preferred embodiment of the television remote control adaptor according to the preferred embodiment of the invention.
Figure 2A:
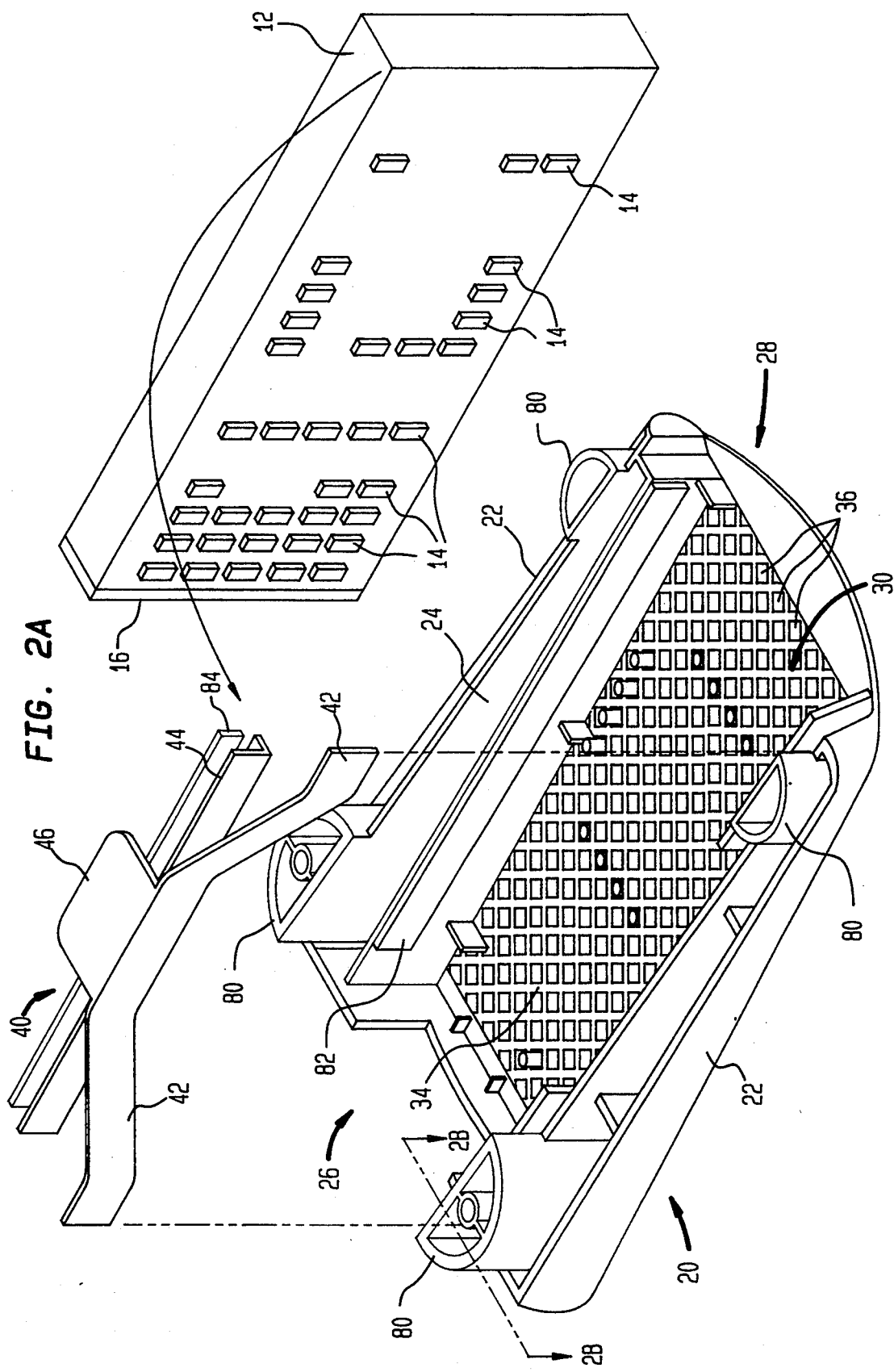
FIG. 2A is a rear perspective exploded view of the adaptor illustrated in FIG. 1.
Figure 2B:
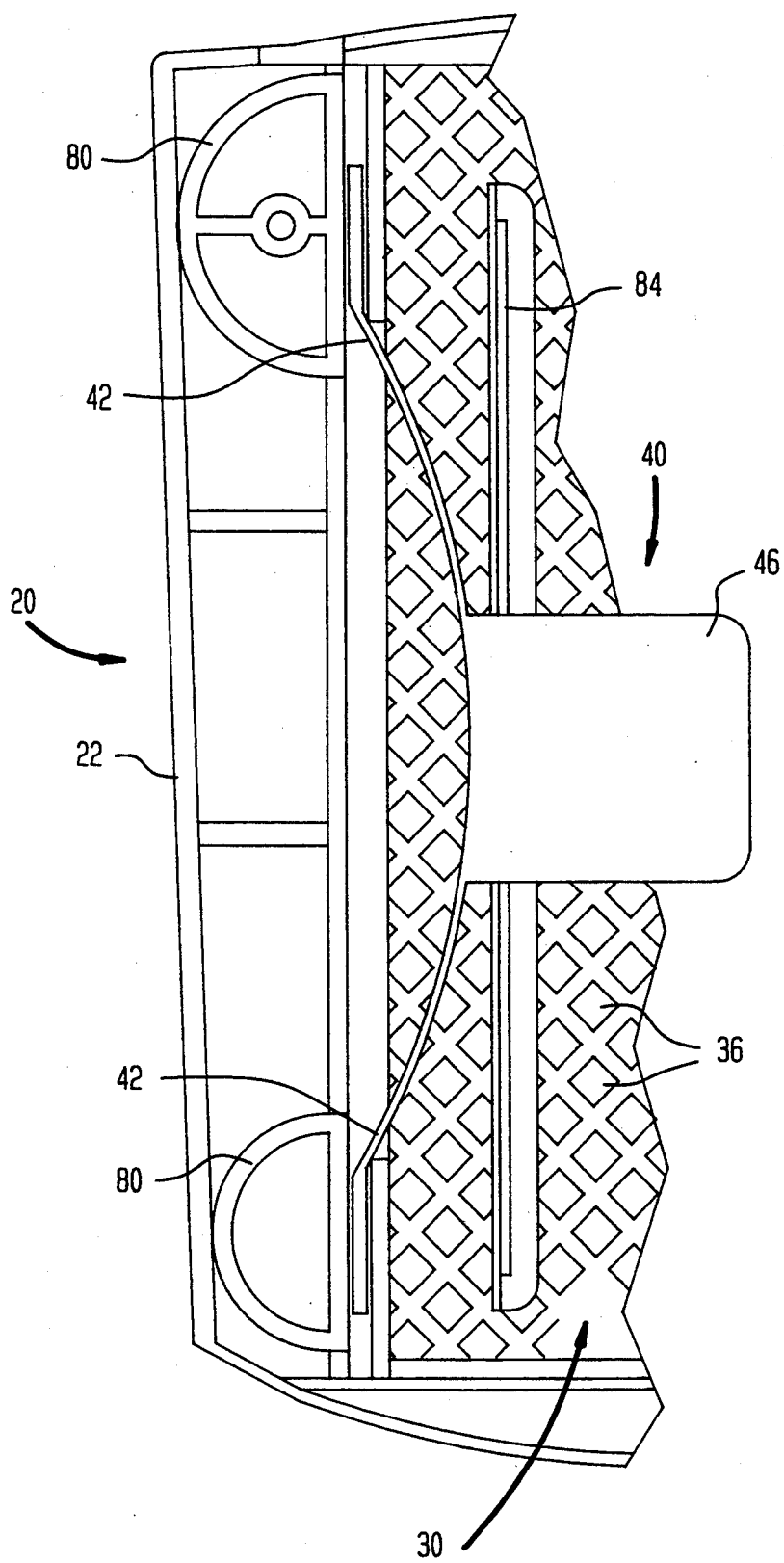
FIG. 2B is a cross-sectional, detailed view of the manner that the retainer spring clip is held in a side channel formed by a pair of opposing tabs.

The structure of the invention may best be initially understood by referring to FIGS. 1, 2A and 2B. A housing 20 is structured to hold a wide or narrow, long or short, thick or thin conventional television remote control unit 12. Typical prior art remote control units 12 include a plurality of pushbuttons 14 and an infrared transmitter section 16. The pushbuttons 14 include ON/OFF buttons, volume UP/DOWN buttons, channel UP/DOWN buttons and specific channel selector buttons. A major advantage of the present invention 10 is that it can accommodate a wide variety of different TV remote control units 12. The invention 10 also simplifies the use of prior art TV remote control units 12 by providing large, color coded L-shaped adaptor buttons 50 that are easy to identify and manipulate. Alternatively, the buttons 50 could take on other geometric shapes too, such as rectilinear, circular, etc. Accordingly, the invention 10 is especially well suited for aged or infirmed persons.

Adaptor housing 20 includes a front face covered by a mesh 30 and a pair of side sections 22. One side 22 includes an interior channel 24 preferably formed by a pair of tabs for retaining spring clip 40. The other side 22 includes a rubber-like pad 82 which opposes pad 84 carried by spring clip 40. Pads 82 and 84 improve the gripping of the clip 40 and prevent slipping. A front aperture 26 permits the infrared transmitters 16 of the remote control unit 12 to remotely actuate the controls on a television. A rear aperture 28 opposite front aperture 26 facilitates the insertion of long remote control units 12 into the housing 20 so that long remote control units 12 can protrude beyond housing 20. Four feet 80 located on the side of said housing 20 help to stabilize the remote control unit 12 when the feet nest on a relatively flat surface.

Mesh 30 includes a front surface 32 which faces outwardly towards the user and a rear surface 34 which faces inwardly towards the remote control unit 12 when properly installed in the housing 20. Mesh 30 is characterized by a plurality of square or rectangular openings 36 having equilateral sides which support and accommodate adaptor buttons 50. Alternatively, the mesh opening 36 could be round or of any regular, repeating shape.

Figure 3:
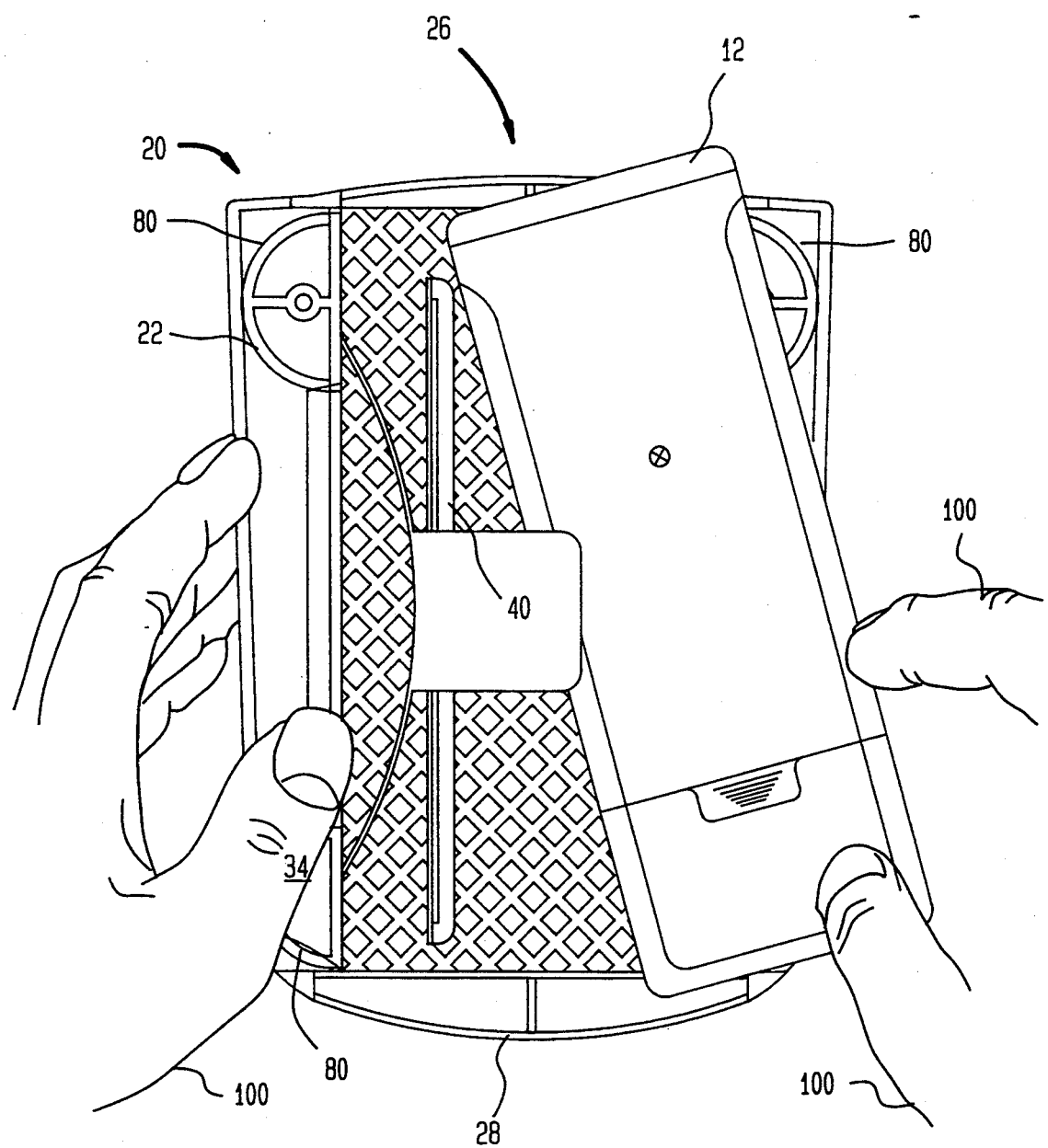
FIG. 3 is a rear view of the invention illustrating the manner by which a remote control unit is installed in the back of the adaptor.
Figure 4B:
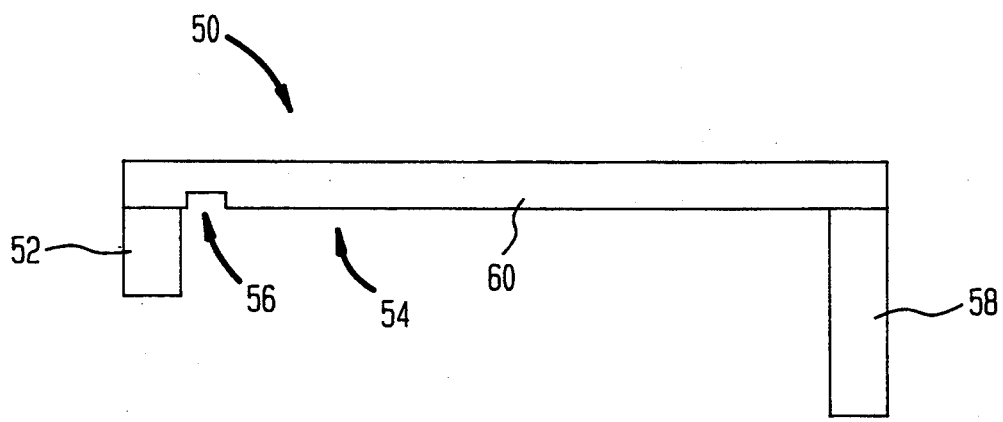
FIG. 4B is a side elevational view of the pushbutton adaptor illustrated in FIG. 4A.
Figure 4A:
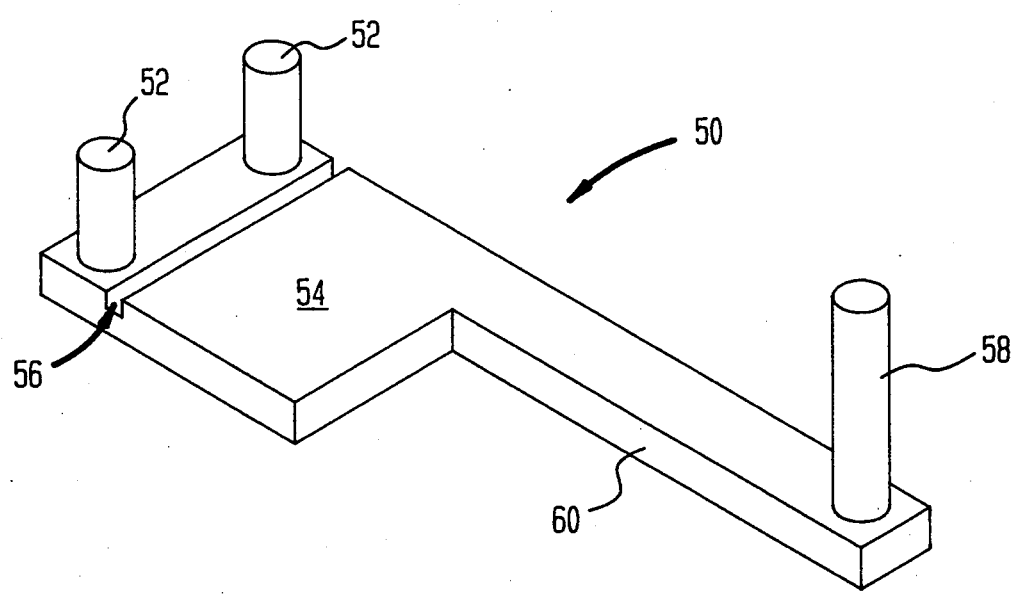
FIG. 4A is a rear perspective view of an L-shaped adaptor button that engages the front mesh of the invention.

The retainer spring clip 40 includes a leaf spring section 42 which travels in channel 24 formed by a pair of opposing tabs in one side 22 of housing 20 as shown in FIG. 2B. Attached to leaf spring section 42 is an L-shaped section 44 which engages the front face of remote control unit 12 and a rear clip section 46 which opposes the L-shaped ledge section 44 and contacts the rear surface of remote control unit 12 as illustrated in FIG. 3.

A plurality of adaptor buttons or adaptor button means 50 are attachable to mesh 30 by a plurality of mesh engaging legs 52. Each adaptor button 50 preferably includes two mesh engaging legs 52. The diameter of each mesh engaging leg 52 is just slightly larger than the size of the openings 36 in the mesh 30. This area might also be undercut or have ribs for retention. According to the preferred embodiment of the invention, the openings 36 in the mesh 30 preferably have a width 0.2 inches square which falls in the range of 0.125 to 0.250 inches. Similarly, the diameter of each mesh engaging leg 52 is approximately 0.210 inches or possible square and falls within the range of 0.135 to 0.260 inches. Most of the adaptor buttons 50 have an L-shape which includes an oversized, square, depressible section 54 which engages the fingers of the user's hand 100 and a long extension section 60 attached to the depressible section 54. A small groove 56 located on the backside of the adaptor button 50 adjacent to the mesh engaging legs 52 increases the flexibility of each adaptor button 50. A long protrusion 58 attached to the distal end of extension 60 and is positionable directly above specific buttons 14 of the remote control unit 12 such as the volume UP/DOWN button, the channel UP/DOWN or the power ON/OFF button. The diameter of the downward protrusion 58 is substantially smaller than the smallest diameter of the openings 36 in the mesh 30 so that the protrusion 58 can easily travel up and down without interfering with the sides of the mesh openings 36.

The adaptor buttons 50 are quite flexible. When the two mesh engaging legs 52 are properly secured to the mesh 30, the downward protrusion 58 should move freely in and out of its respective mesh opening 36. When the large, depressible section 54 is pressed downwardly by a finger of the hand of the user 100, the leg section 52 acts like the fulcrum of a lever with the downward protrusion 58 acting as the other end of the lever. Groove 56 makes the L-shaped adaptor button act like a living hinge so that a small downward motion applied to the depressible section 54 is magnified into a larger downward movement of the protrusion 58 triggering activation of the respective volume or channel selector UP/DOWN control button.

As previously described, a major advantage of the housing 20 is that it can accommodate a large number of conventional TV remote control units 12 regardless of their width, length or thickness. This is possible because the movable spring 40 pushes the remote control unit 12 against the pad 82 on the opposite sidewall 22 so that it automatically self-adjusts for the width of the remote control unit 12 and consistently locates the remote control unit 12 in the same exact location and orientation each time. The aperture 28 in the rear of the housing 20 allows a long remote 12 to protrude beyond the length of the housing 20 itself. Fortunately, in most cases, the desired TV remote control buttons 14 are locatable and accessible within the length of the housing 20 and mesh area. The rear flexible clip section 46, affixed to the leaf spring section 42, holds the remote 12 against the rear surface 34 of the mesh area 30, thereby adjusting to the thicknesses of different remote control units 12. The angular L-shaped lip section 44 orients the remote 12 at the proper distance away from the rear surface 34 of the mesh 30. This allows the button pins or protrusions 58 to precisely reach the remote buttons 14, and keeps the remote buttons 14 from pressing against the rear surface 34 of mesh 30, thereby inadvertently draining the batteries of the remote 12. Moreover, the shape of the housing 20 forces the remote 12 into a flat orientation with respect to a flat surface or a chair arm rest and at a sufficient angle to facilitate its use in order to accurately point the infrared beam emerging from the front aperture 26 towards the TV.

Adaptor buttons 50 are firmly mountable, but removable, with respect to mesh openings 36. The groove 56, which comprises a thin portion of the flexible, depressible section 54, acts like a living hinge and allows the pushbutton adaptor 50 to flex and act like a lever moving about a pivot. Therefore, any downward force applied to the depressible section 54 or extension section 60 of the L-shaped adaptor button 50, will move the protrusion 58 downward into the mesh opening 36, thereby depressing one of the underlying remote buttons 14. The inherent spring action of each remote button 14 spring action will automatically return the large adaptor button 50 to its normal rest position.

The L-shape of the adaptor buttons 50 make it possible for the adaptor buttons 50 to nest within each other as shown in FIG. 1. Therefore, it is possible to place the enlarged adaptor buttons 50 together in relatively close proximity so that the user only needs one finger of his or her hand 100 to operate the invention 10.

One of the major advantages of the present invention is that it helps to protect against breakage of the original remote control unit. Accordingly, it is preferable that the housing 20 be made of a high impact plastic. Mesh area 30 is also moldable from a suitable high impact plastic as are the L-shaped adaptor buttons 50 which snap into the mesh 30 over the existing remote buttons 14. To further assist in identifying the adaptor buttons 50, it may be desirable to apply a set of self-adhesive labels to identify functions such as volume UP, volume DOWN, channel UP, channel DOWN and power ON/OFF. Color-coded graphics for the channel UP button 62, the channel DOWN button 64, the volume UP button 66, the volume DOWN button 68 and the power ON/OFF button 70 as shown in FIG. 1, in combination with the increase in size, make the adaptor buttons 50 especially easy to use because of their increased tactile area and improved visibility.

The preferred embodiment of the invention 10 is installed and used in the following manner. First, the user 10 places the existing remote control unit 12 into the spring clip 40. This forces the remote control unit 12 into proper orientation, i.e. into an exact repeatable location, with respect to the housing 20. See FIG. 3.

Next, the user 100 installs the large adaptor buttons 50 so that the mesh engaging legs 52 engage the proper openings 36 in the mesh 30 and so that the protrusion 58 of each L-shaped adaptor button 50 is located directly above the desired remote control pushbutton 14. According to the example illustrated in FIG. 1, the user would place four L-shaped adaptor buttons 50 onto the mesh 36 including the channel UP button 62, the channel DOWN button 64, the volume UP button 66, the volume DOWN button 68. A single square, non-L-shaped, power ON/OFF button 70 is typically located in one corner of the mesh 30. While a square button 70 is illustrated, it is possible that an L-shaped adaptor button 50 could also be used to control the power ON/OFF function.

Lastly, the user 100 designates the function of each large L-shaped adaptor button 50 to correspond to the function of each of the TV remote control buttons 14 located underneath of it. This is preferably done by applying self-adhesive labels with differing graphics and color-coding. The large adaptor buttons 50 securely attach themselves to the openings 36 of mesh 30 but, as previously described, are permitted to flex easily, thereby taking advantage of the spring action of the remote pushbutton 14 underneath. The unique lever effect of the L-shaped adaptor buttons 50 causes any pressing action by the user 100 on the large depressible section 54 of the adaptor button 50 to be transferred and magnified with respect to the protruding pin 58 over the corresponding remote pushbutton 14. Accordingly, another unique characteristic of the invention 10 is that it does not deface or alter the existing remote control unit 12 that it accommodates.

In summary, the foregoing invention has several major advantages over prior art devices. First, and foremost, it permits users having limited visual and manual capabilities to easily locate the proper remote control buttons and to actuate them. The oversized shape of the adaptor buttons 50 make them easier to see and the lever-pivot action of the L-shaped buttons 50 make them easier to manipulate. The L-shape of the adaptor buttons 50 also makes it possible to nest the adaptor buttons 50 in a convenient array such as illustrated in FIG. 1 so that they can be operated by one finger or the thumb of the user hand 100. Second, the invention 10 protects the remote control unit 12, thereby eliminating the cost of purchasing substitute or replacement remote controls. Third, the operation of the remote control unit 12 is simplified by reducing its functional controls to five, namely volume UP 66, volume DOWN 68, channel UP 67, channel DOWN 64, and power ON/OFF 70. Fourth, the invention is relatively easy to use. Installation of the remote control unit 12 into the housing 20 only takes less than a minute for the average user. Adjusting the adaptor buttons 50, selecting their location and adding the appropriate graphics may take another minute or more. At a maximum, it should take no more than five minutes for the average user to install the remote control unit 12 and to set and install the appropriate adaptor buttons 62-70. Fifth, the invention 10 can accommodate a wide variety of different remote control units 12 regardless of their width, length, or thickness.

While the invention has been described with reference to its preferred embodiment, it will appreciate by those of ordinary skill in the art that various modifications can be made to the structure and function of the invention without departing from the spirit and scope thereof. In particular, even though the invention has been described with regard to a TV remote control adaptor, it will be appreciated that other types of remote control units, such as those used for controlling stereo sound systems, could also be accommodated by the preferred embodiment of the present invention.

I claim:

1. An adaptor apparatus for receiving a remote control unit having an infrared transmitter and a plurality of control pushbuttons, said apparatus comprising:
   a housing for receiving said remote control unit;
   mesh means attached to said housing, said mesh means having an outer surface that faces outwardly and an inner surface that faces said remote control unit when installed in said housing;
   retainer means for retaining said remote control unit in said housing; and,
   adaptor button means attached to said housing for activating said control pushbuttons of said remote control unit.

2. An adaptor apparatus for receiving a remote control unit having an infrared transmitter and a plurality of control pushbuttons, said apparatus comprising:
   a housing for receiving said remote control unit;
   spring means for biasing said remote control unit in said housing;
   a plurality of adaptor button means for activating said control pushbuttons of said remote control unit; and,
   support means attached to said housing for supporting said plurality of adaptor button means and for independently positioning said adaptor button means with respect to each other and with respect to said remote control unit,
   wherein at least three of said adaptor buttons means can be independently positioned with respect to said control pushbuttons of said remote control unit.

3. The apparatus of claim 1 wherein said adaptor button means comprises:
   a mesh means engaging section;
   a depressible section attached to said mesh engaging section;

an extension section attached to said depressible section; and, a protruding section attached to said extension section, wherein said protruding section passes through said mesh means, wherein said depressible section is locatable on the outside surface of said mesh means such that depression of said adaptor button means causes said protruding section to contact at least one of said remote control pushbuttons.

4. The apparatus of claim 3 wherein said retainer means comprises a spring means.

5. The apparatus of claim 4 wherein said housing includes a front aperture therein, wherein said aperture is located adjacent said infrared transmitter of said remote control unit so that said infrared transmitter can transmit through said housing.

6. The apparatus of claim 5 wherein said mesh engaging section of said adaptor button means comprises at least one leg having a diameter slightly larger than the openings in said mesh so that said leg can frictionally engage said mesh means.

7. The apparatus of claim 6 wherein said mesh engaging section comprises two legs.

8. The apparatus of claim 7 wherein said housing includes two sides at least one of which includes a channel therein for receiving said spring means.

9. The apparatus of claim 8 wherein said spring means comprises:

a leaf spring section engagable in said channel in said housing;

an L-shaped section attached to said leaf spring section; and, a rear clip section for holding said remote control unit against said L-shaped section.

10. The apparatus of claim 9 wherein said mesh means comprises a mesh having openings therein in the range of 0.125 inches to 0.250 inches.

11. The apparatus of claim 10 wherein said remote control unit comprises a television remote control unit.

12. The apparatus of claim 11 wherein said adaptor button means comprises at least five adaptor button means.

13. The apparatus of claim 12 wherein said depressible section and said extension section of said adaptor button means have a general L-shape.

14. The apparatus of claim 13 further comprising:
label means attachable to said adaptor button means for identifying said adaptor button means.

15. The apparatus of claim 14 further comprising:
a plurality of feet attached to said housing,
wherein said feet improve the stability of said remote control unit when said feet of said remote control unit rest on a surface.

16. The apparatus of claim 15 when said two legs of said mesh engaging section have a diameter in the range of 0.135 to 0.260 inches.

17. The apparatus of claim 16 further including:
pad means attached to said housing and said spring means for helping to hold said remote control unit in said housing.

* * * * *